United States Patent
Watanabe et al.

(12)

(10) Patent No.: US 6,303,230 B1
(45) Date of Patent: Oct. 16, 2001

(54) LAMINATES

(75) Inventors: Hisashi Watanabe, Kisarazu; Takashi Tanaka, Kimitsu; Hiroyuki Chinju, Chiba; Seigo Oka; Soichiro Kawamura, both of Kimitsu; Taeko Hayama, Kisarazu, all of (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 0 days.

(21) Appl. No.: 08/875,037

(22) PCT Filed: Jan. 17, 1996

(86) PCT No.: PCT/JP96/00060

§ 371 Date: Oct. 22, 1997

§ 102(e) Date: Oct. 22, 1997

(87) PCT Pub. No.: WO96/22597

PCT Pub. Date: Jul. 25, 1996

(30) Foreign Application Priority Data

Jan. 17, 1995 (JP) .................................................. 7-005264

(51) Int. Cl.$^7$ .......................... B32B 15/08; B32B 15/20; G11B 5/27; H05K 1/00
(52) U.S. Cl. ........................ 428/458; 360/104; 428/463; 428/473.5; 430/69; 174/258
(58) Field of Search ..................................... 428/209, 215, 428/901, 199, 457, 458, 463, 461, 473.5; 430/69, 496, 524, 536; 360/104, 103; 174/250, 258

(56) References Cited

U.S. PATENT DOCUMENTS

| H1299 | * | 4/1994 | Charles | 430/331 |
| 4,328,262 | * | 5/1982 | Kurahashi et al. | 427/93 |
| 4,741,988 | * | 5/1988 | Van Der Zande et al. | 430/312 |
| 5,208,066 | * | 5/1993 | Fujisaki et al. | 427/96 |
| 5,306,741 | * | 4/1994 | Chen et al. | 522/164 |
| 5,374,469 | * | 12/1994 | Hino et al. | 428/209 |
| 5,470,693 | * | 11/1995 | Sachdev et al. | 430/315 |
| 5,601,905 | * | 2/1997 | Watanabe et al. | 428/215 |
| 5,666,717 | * | 9/1997 | Matsumoto et al. | 29/603.12 |

FOREIGN PATENT DOCUMENTS

| 52 22071A | 2/1977 | (JP) . |
| 60 246015A | 12/1985 | (JP) . |
| 62 291087A | 12/1987 | (JP) . |
| 5 54516A | 3/1993 | (JP) . |
| 6 37459A | 2/1994 | (JP) . |
| 06-085431 A | * 3/1994 | (JP) . |
| 6 268378A | 9/1994 | (JP) . |
| 8 45213A | 2/1996 | (JP) . |
| 0918114 | 1/1997 | (JP) . |

* cited by examiner

*Primary Examiner*—Deborah Jones
*Assistant Examiner*—Michael LaVilla
(74) *Attorney, Agent, or Firm*—Birch, Stewart, Kolasch & Birch, LLP

(57) ABSTRACT

This invention relates to laminates in which a layer of polyimide precursors and a layer of photosensitive resins are formed one on top of another on an electric conductor such as a stainless steel foil and also to laminates consisting of a stainless steel foil and successive layers of polyimide precursors and photosensitive resins useful for the manufacture of HDD suspensions. In particular, the use of resins containing a repeating unit derivable from specific aromatic diamines and aromatic carboxylic acid dianhydrides as polyimide precursors makes it possible to fabricate an insulator of high fabrication accuracy and reliability on an electric conductor and, in addition, the laminates are useful as materials for the manufacture of HDD suspensions of an integrated circuit/wiring structure with high accuracy.

5 Claims, No Drawings

LAMINATES

FIELD OF TECHNOLOGY

This invention relates to laminates which serve as materials suitable for HDD (hard disk drive) suspensions.

BACKGROUND TECHNOLOGY

Partial removal of the insulator on an electric conductor has often been practiced for the purpose of exposing the electric conductor in a terminal. A technique thereby employed is to paste a punched-out insulating film on the electric conductor and pattern the electrically conducting portion. Another technique is to remove the insulator underneath the patterned electric conductor by a special chemical [Japan Kokai Tokkyo Koho No. Sho 52-22071 (1977)] or by laser [Japan Kokai Tokkyo Koho No. Sho 62-22071 (1987)]. The former technique, based on fabrication by punching, poses problems of difficulties in attaining accuracy and also of expenditure for molds. On the other hand, the latter technique requires hazardous chemicals such as strong alkali and costly equipment for generation of laser and plasma and also poses the problem of low productivity.

An HDD (hard disk drive) suspension has been prepared by etching a stainless steel foil and a thin-film magnetic head is mounted on the tip of the suspension and packaged by wire bonding with a gold wire. A general structure of such HDD suspension is described in PETEROTECH, Volume 18, Number 11, page 351.

In recent years, however, active studies directed to smaller size and higher density and capacity of HDD suspensions are under way and the indispensable theme of such studies is low rise of suspensions (sliders). From this viewpoint, the conventional gold wire is an obstacle to low rise and, in addition, its resistance to air flow is detrimental to high-speed manufacture.

To solve the problem in question, an attempt has been made to form patterns of insulating polyimides directly on a stainless steel foil and then form a copper ciurcuit on the polyimides as disclosed in Japan Kokai Tokkyo Koho No. Sho 60-246015 (1985).

A technique such as this, however, still faces difficulties in forming a fine circuit. There are also problems, although latent, such as poor adhesion of polyimides to the substrate stainless steel foil and a long period of time, too long for an operation on an industrial scale, required for alkali etching of polyimide precursors.

An object of this invention is to provide laminates of high reliability and fabrication accuracy and excellent workability which allow the preparation of circuit boards by fabrication of the insulator.

Another object of this invention is to provide laminates of high reliability and fabricability useful for the preparation of HDD suspensions.

DISCLOSURE OF THE INVENTION

Accordingly, this invention relates to laminates which consist of an electric conductor and layers, formed one on top of another, of polyimide precursors and photosensitive resins.

This invention also relates to laminates which consist of a stainless steel foil and layers, formed one on top of another, of polyimide precursors and photosensitive resins and are useful for the preparation of HDD suspensions and, preferably, said polyimide precursors have a main structural unit represented by the following general formula (2)

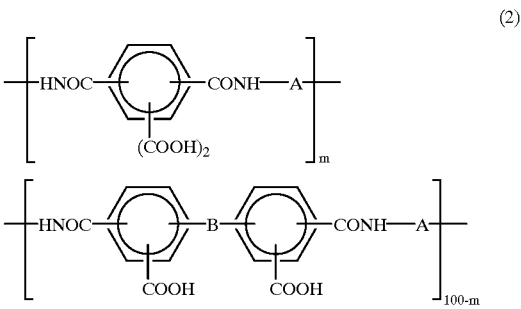

wherein A is the divalent residue of an aromatic group containing 17 or less carbon atoms, B is —CO—, —$SO_2$— or —O— and m is an integer from 0 to 100.

Photosensitive resins may vary in structure, their choice being optional, and they may be either negative-working or positive-working. Photosensitive resins are normally ultraviolet-reactive or electron beam-reactive and they are composed of base oligomers, reactive diluents, photoinitiators, photosensitizers, pigments, polymerization inhibitors and the like. As base oligomers are known epoxy acrylates, urethane acrylates and polyester acrylates.

Ultraviolet-curable acrylic resins are particularly desirable as photosensitive resins because of their resistance to alkali and to penetration of water during etching of a layer of polyimide precursors. Most desirable are acrylic photosensitive resins which can be developed and stripped by acids. Their thickness is preferably 2 to 100 $\mu$m. A film with a thickness of less than 2 $\mu$m lacks strength, though fabrication accuracy is high, and tends to cause problems such as peeling during etching of polyimide precursors. A film with a thickness in excess of 100 $\mu$m, though strong and highly reliable, suffers from loss of fabrication accuracy and increase in cost.

Polyimide precursors are synthesized by treating diamines (or their derivatives) with tetracarboxylic acid dianhydrides (or their derivatives) in a polar solvent at 0 to 200° C. The occurrence of imidation in the course of this reaction is undesirable as it decreases solubility and extends the etching time during patterning.

Polar solvents include N-methylpyrrolidone (NMP), dimethylformamide (DMF), dimethylacetamide (DMAc), dimethyl sulfoxide (DMSO), dimethyl sulfate, sulfolane, butyrolactone, cresol, phenol, halogenated phenols, cyclohexanone, dioxane, tetrahydrofuran and diglyme.

Diamines (or their derivatives) include p-phenylenediamine, m-phenylenediamine, 2'-methoxy-4,4'-diaminobenzanilide, 4,4'-diaminodiphenyl ether, diaminotoluene, 4,4'-diaminodiphenylmethane, 3,3'-dimethyl-4,4'-diaminodiphenylmethane, 2,2-bis[4-(4-aminophenoxy)phenyl]propane, 1,2-bis(anilino)ethane, diaminodiphenyl sulfone, diaminobenzanilide, diaminobenzoate, diaminodiphenyl sulfide, 2,2-bis(p-aminophenyl) propane, 2,2-bis(p-aminophenyl) hexafluoropropane, 1,5-diaminonaphthalene, diaminobenzotrifluoride, 1,4-bis(p-aminophenoxy) benzene, 1,3-bis(p-aminophenoxy)benzene, 4,4'-(p-aminophenoxy)biphenyl, diaminoanthraquinone, 4,4'-bis(3-aminophenoxyphenyl)diphenyl sulfone, 1,3-bis(anilino)

hexafluoropropane, diaminosiloxanes represented by the following general formula

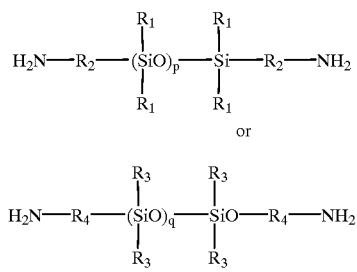

or (wherein $R_2$ and $R_4$ are divalent organic groups, $R_1$ and $R_3$ are monovalent organic groups and p and q are integers greater than 1), 2,2-bis[4-(p-aminophenoxy)phenyl] hexafluoropropane, 2,2-bis[4-(3-aminophenoxy) phenyl] hexafluoropropane, 2,2-bis[4-(2-aminophenoxy)phenyl] hexafluoropropane, 2,2-bis[4-(4-aminophenoxy)-3,5-dimethylphenyl]hexafluoropropane, 2,2-bis[4-(4-aminophenoxy)-3,5-di(trifluoromethyl)phenyl] hexafluoropropane, p-bis(4-amino-2-trifluoromethylphenoxy)benzene, 4,4'-bis(4-amino-2-trifluoromethylphenoxy)biphenyl, 4,4'-bis(4-amino-3-trifluoromethylpheno xy)biphenyl, 4,4'-bis(4-amino-2-trifluoromethylphenoxy)diphenyl sulfone, 4,4'-bis(4-amino-5-trifluoromethylphenoxy)diphenyl sulfone, 2,2-bis[4-(4-amino-3-trifluoromethylphenoxy)phenyl] hexafluoropropane, benzidine, 3,3',5,5'-tetramethylbenzidine, octafluorobenzidine, 3,3'-dimethoxybenzidine, o-tolidine, m-tolidine, 2,2',5,5',6,6'-hexafluorotolidine, 4,4"-diaminoterphenyl and 4,4'''-diaminoquaterphenyl or diisocyanates resulting from the reaction of these diamines with phosgene.

Any of these diamines (or their derivatives) may be used and it is desirable that the main components are diamines containing the main structural unit represented by the aforementioned general formula (2), that is, diamines whose A is the divalent residue of an aromatic group with 17 or less carbon atoms. When the main components are diamines with more than 17 carbon atoms, the time for alkali etching of polyimide precursors becomes extremely long, which lowers productivity and makes high-accuracy fabrication difficult. Hence, it is desirable that 80 mol % or more of the diamines are aromatic diamines with 17 or less carbon atoms.

Tetracarboxylic acid anhydrides (or their derivatives) include the following and it is to be understood that, although tetracarboxylic acids are shown as examples, their esters, acid anhydrides, and acid halides can certainly be used; pyromellitic acid, 3,3',4,4'-biphenyltetracarboxylic acid, 3,3', 4,4'-benzophenonetetracarboxylic acid, 3, 3',4,4'-(diphenyl sulfone)tetracarboxylic acid, 3,3',4,4'-(diphenyl ether) tetracarboxylic acid, 2,3,3',4'-benzophenonetetracarboxylic acid, 2,3,6,7-naphthalenetetracarboxylic acid, 1,2,5,6-naphthalenetetracarboxylic acid, 3,3',4,4'-diphenylmethanetetracarboxylic acid, 2,2-bis(3,4-dicarboxyphenyl)propane, 2, 2-bis(3, 4-dicarboxylphenyl) hexafluoropropane, 3,4,9,10-tetracarboxyperylene, 2,2-bis [4-(3,4-dicarboxyphenoxy)phenyl]propane, 2,2-bis[4-(3,4-dicarboxyphenoxy) phenyl]hexafluoropropane, butanetetracarboxylic acid and cyclopentanetetracarboxylic acid. Trimellitic acid and its derivatives are also useful.

It is desirable that the main components of these tetracarboxylic acid anhydrides (or their derivatives) are those which contribute to form the main structural unit represented by the aforementioned general formula (2) and, concretely, they include pyromellitic anhydride, 3,3',4,4'-benzophenonetetracarboxylic acid, 3,3',4,4'-(diphenyl sulfone) tetracarboxylic acid and 3,3',4,4'-(diphenyl ether) tetracarboxylic acid. They should preferably account for 80 mol % or more of the acid anhydrides used.

The subscript m in the aforementioned general formula (2) indicates the proportion of a given subunit and it is in the range from 0 to 100, preferably from 30 to 100. The main structural unit means that the structural unit in question accounts for 60 mol % or more, preferably 80 mol % or more, of the structural units of polyimide precursors.

The use of acid anhydrides other than those mentioned above causes problems such as longer time for the alkali etching of a polyimide precursor layer and increased difficulty for performing high-accuracy fabrication.

It is possible to introduce a crosslinked or ladder structure by modification with compounds containing reactive functional groups. For example, the following methods are available for such modification.

(a) Introduction of the pyrrolone or isoindoloquinazolinedione ring is possible by modification with compounds of the following general formula (3)

(3)

wherein $R_5$ is the residue with (2+X) valence (X is 1 or 2) of an aromatic group and Z is a substituent selected from $-NH_2$, $-CONH_2$ and $-SO_2NH_2$ and positioned ortho to the amino group.

(b) Modification with derivatives containing polymerizable unsaturated bonds of amines, diamines, dicarboxylic acids, tricarboxylic acids or tetracarboxylic acids effected to form crosslinked structures in the course of curing. Maleic acid, nadic acid, tetrahydrophthalic acid or ethynylaniline may be used as unsaturated compound.

(c) Modification with aromatic amines containing phenolic hydroxyl group or carboxylic group is effected to form crosslinking agents containing reactive hydroxyl or carboxyl group.

According to this invention, the polyimide precursors thus prepared are put in place as film in contact with a layer of photosensitive resins and it is preferable that the resin layers cure with a thermal expansion coefficient of $5 \times 10^{-5}/°$ C. or less. When the thermal expansion coefficient exceeds $5 \times 10^{-5}/°$ C., particularly in applications to HDD suspensions, the circuit warps on cooling after processing by high-temperature heat treatment for imidation and such warpage tends to cause troubles in practical use.

Polyimide precursors containing a repeating unit represented by the following general formula (1)

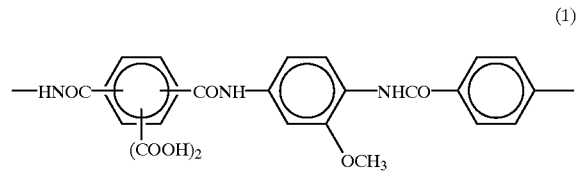

(1)

are more preferable as they cure with a small thermal expansion coefficient and are easy to fabricate.

For the purposes of controlling the thermal expansion coefficient or adjusting the mechanical properties, it is possible to utilize copolymerization or blending with the use of the aforementioned compounds in addition to these repeating units. Moreover, there are other possibilities such as mixed use of powders, fibers or chopped strands of inorganic or organic substances or metals for improvement of a variety of properties, addition of antioxidants for prevention of the oxidation of circuits during curing or of silane coupling agents for improvement of adhesion and blending of different kinds of polymers for improvement of flexibility, flow or adhesion. As needed, the polyimide layer can be made multilayer.

The thickness of a polyimide precursor layer is 2 to 300 μm, preferably 2 to 100 μm. When the thickness is less than 2 μm, the circuit loses reliability for insulation and deteriorates in mechanical properties such as folding endurance. Degradation tends to occur in the course of imidation with the thickness in excess of 300 μm while the etching accuracy drops with the thickness in excess of 100 μm.

A foil of copper, aluminum or stainless steel may be used as electric conductor. A stainless steel foil, on account of its modulus, is desirable as material for HDD suspensions. The thickness is optional, but it is desirably 200 μm or less for reasons of manufacture and fabrication. In particular, a foil as material for the manufacture or fabrication of HDD suspension preferably has a thickness in the range from 10 to 70 μm. When the thickness of a foil exceeds 70 μm, low rise becomes difficult to maintain while in use as HDD suspension or the fabrication into suspensions by folding or the etching of stainless steel becomes difficult. On the other hand, a thickness of less than 10 μm is undesirable for lack of elasticity as suspension. It is allowable to roughen the surface of a foil or form a layer of alloy or primer on the surface for improvement of adhesion.

Laminates of this invention are usually prepared by applying polyimide precursors to an electric conductor, drying, further applying photosensitive resins and drying. The applied solution of the polyimide precursors is dried at a temperature chosen from within the range which does not degrade the photosensitive resins or release films and, preferably, at 180° C. or less. Imidation takes place above this temperature, which undesirably results in longer etching time during patterning of the polyimide precursors. The temperature for drying the photosensitive resins is chosen from within the range which does not adversely affect the photosensitivity and it is preferably 150° C. or less.

After the formation of laminates in this manner, it is advisable to paste a protective film on the photosensitive resin layer for protection against dust. Such protective film may be chosen from commonly available films of polyesters, polypropylene and polyimides and films coated with release agents such as silicones for easier release after fabrication may be used.

The laminates thus obtained are exposed and developed to form a desired pattern on the photosensitive resin layer and then treated with an alkaline solution to etch the polyimide precursor layer. It is possible to apply heat during etching to increase the processing speed. Thereafter, the photosensitive resin layer is stripped and the polyimide precursor layer is cured. Though the conditions are optional, the curing is effected at 200° C. or more, preferably at 250° C. or more, to let polyimides fully show their characteristics. As for the method of heating, it is possible to apply batch heating in a hot-air oven or roll-to-roll heating.

In the manufacture of HDD suspensions or advantageously of HDD suspensions in which circuits are formed directly on an integrated structure of gimbals and load beam, a patterned polyimide layer is formed as insulation layer on a stainless steel foil in the manner described above and what follows next in the fabrication into a suspension is the formation of an electric conductor on the patterned insulation layer in an optional manner. For example, a thin layer of metal such as copper and nickel is formed by sputtering on polyimides and subsequently plated electrolytically by an electric conductor such as copper.

In the plating step, it is possible, as needed, to protect polyimides which are to be patterned for wiring with the use of photosensitive resins and need not be plated, the sputtered surface, or the stainless steel surface.

The wiring thus formed by plating can be provided, as needed, with a plated layer of nickel/gold and the like on its top for prevention of corrosion and also with an uppermost layer of resins such as polyimides for insulation.

A stainless steel foil thus provided with wiring is finally fabricated into a suspension with its external shape formed by either etching or punching of the foil.

Fabrication by bending follows to finish a suspension, with a heat treatment given as needed for removal of strain.

The shape of a suspension varies with the intended use as described in the aforementioned publication. In the assembly step, a head such as thin-film magnetic head and MR head is packaged on the surface of this base board at a fairly high temperature.

PREFERRED EMBODIMENT OF THE INVENTION

This invention will be described concretely below with reference to the accompanying examples and it goes without saying that this invention is not limited to these examples.

The thermal expansion coefficient was determined on the sufficiently imidized sample with the aid of a thermomechanical analyzer (TMA) by heating the sample up to 250° C., then cooling at a rate of 10° C./min and calculating the average thermal expansion coefficient between 240° C. and 100° C.

The soldering resistance was determined by leaving a circuit at 76% RH for 24 hours, immersing the circuit in a solder bath for 1 minute and measuring the maximum temperature at which no blistering nor peeling occurs while examining the circuit at 10° C. intervals.

The fabrication accuracy was evaluated by etching a polyimide precursor layer with the use of circular patterns differing from one another by 10 μm in diameter and finding the diameter of a well shaped pattern by visual observation. Alternatively, the fabrication accuracy was evaluated by etching with the use of a negative film containing a pattern of alternating 100 μm-wide lines and 100 μm-wide gaps, observing a cross section of the polyimide layer and calculating the etch factor (f) from the following equation;

$$f = 2\ d/(t_1 - t_2)$$

wherein $t_1$ is the length of the lower side of the trapezoidal cross section, $t_2$ is the length of the upper side of the trapezoidal cross section and d is the thickness of the polyimide layer.

Synthetic Example 1

In 220 ml of DMAc (dimethylacetamide) placed in a 300-ml four-necked flask fitted with a thermometer, a calcium chloride tube, a stirrer and an inlet tube for nitrogen were dissolved 0.07 mole of 2'-methoxy-4,4'-diaminobenzanilide and 0,03 mole of 4,4'-diaminodiphenyl ether with stirring in a current of nitrogen flowing at a rate of 200 ml per minute. While cooling the resulting solution to 10° C. or less in an ice bath, 0.10 mole of pyromellitic dianhydride was added slowing to the solution. Thereafter, the reaction mixture was stirred continuously at room temperature for approximately 2 hours to effect polymerization. There was obtained a brown, transparent viscous solution of polyimide precursors.

Synthetic Example 2

In 220 ml of NMP (N-methyl-2-pyrrolidone) placed in a 300-ml four-necked flask fitted with a thermometer, a calcium chloride tube, a stirrer and an inlet tube for nitrogen was dissolved 0.10 mole of 4,4'-diaminodiphenyl ether with stirring in a current of nitrogen flowing at a rate of 200 ml per minute. While cooling the resulting solution to 10° C. or less in an ice bath, 0.05 mole of 3,3',4,4'-benzophenonetetracarboxylic acid anhydride and 0.05 mole of pyromellitic dianhydride were added slowing to the solution. Thereafter, the reaction mixture was stirred continuously at room temperature for approximately 2 hours to effect polymerization. There was obtained a brown, transparent viscous solution of polyimide precursors.

Synthetic Example 3

In 220 ml of DMAc (dimethylacetamide) placed in a 300-ml four-necked flask fitted with a thermometer, a calcium chloride tube, a stirrer and an inlet tube for nitrogen was dissolved 0.10 mole of 4,4'-diaminodiphenylmethane with stirring in a current of nitrogen flowing at a rate of 200 ml per minute. While cooling the resulting solution to 10° C. or less in an ice bath, 0.10 mole of BTDA (3,3',4,4'-benzophenonetetracarboxylic acid anhydride) was added slowing to the solution. Thereafter, the reaction mixture was stirred continuously at room temperature for approximately 2 hours to effect polymerization. There was obtained a yellow, transparent viscous solution of polyimide precursors.

Synthetic Example 4

A solution of polyimide precursors was synthesized as in the aforementioned Synthetic Example 3 except replacing 4,4'-diaminodiphenylmethane with 1,4-bis(p-aminophenoxy)benzene.

Synthetic Example 5

A solution of polyimide precursors was synthesized as in the aforementioned Synthetic Example 3 except replacing BTDA (3,3',4,4'-benzophenonetetracarboxylic acid anhydride) with DSDA [3,3',4,4'-(diphenyl sulfone) tetracarboxylic acid anhydride].

Synthetic Example 6

A solution of polyimide precursors was synthesized as in the aforementioned Synthetic Example 3 except replacing BTDA (3,3',4,4'-benzophenonetetracarboxylic acid anhydride) with BPDA (3,3',4,4'-biphenyltetracarboxylic acid anhydride).

EXAMPLE 1

The polyimide precursor solution obtained in Synthetic Example 1 was applied to the roughened surface of a commercially available 35 $\mu$m-thick electrolytic copper foil (product of Mitsui Kinzoku Co., Ltd.) to a dry thickness of 40 $\mu$m and dried at 120° C. for 6 minutes. On top of the polyimide precursors were applied commercially available acid-developing type acrylic photosensitive resins (NCAR, product of Tokyo Process Co., Ltd.) to a dry thickness of 20 $\mu$m and dried at 110° C. for 1 minute. A 15 $\mu$m-thick polyester film was laminated to give a four-layer laminate with the structure of copper foil/polyimide precursor layer/ photosensitive resin layer/protective film.

A negative film measuring 10 cm×10 cm and possessing the aforementioned circular pattern was placed in contact with the protective film of the laminate and exposed to an amount of light of approximately 100 mmNJ/cm$^2$ in a discharge type exposure equipment, Hitech's Model 3000NEL. Thereafter, the laminate was stripped of the protective film and the exposed resins were developed in a simplified shower by a 0.5% aqueous solution of lactic acid at 30° C. and at a water pressure of 1 kg/cm$^2$ for 30 seconds.

The base board whose photosensitive resin layer alone had been patterned was etched in a simplified shower by a 10% aqueous solution of sodium hydroxide at a liquid temperature of 45° C. and at a water pressure of 1.5 kg/cm$^2$ for 35 seconds and then etched by warm water under the same conditions. The bare portion of the polyimide presursor layer was removed clean and the substrate copper foil was visually confirmed.

The remaining photosensitive resins were stripped by applying a shower of a 10% aqueous solution of lactic acid at 30° C. and at a water pressure of 1 kg/cm$^2$ for 40 seconds. The base board thus obtained was washed with water, heated in a hot-air oven at 130° C. for 10 minutes, and then heated successively at 160,200, 250 and 300° C. for 2 minutes at each temperature. The base board possessed a 25 $\mu$m-thick polyimide insulation layer with circular patterns, the polyimide layer was in contact with the copper foil free of voids when the cross section of the board was observed, and the board was extremely good in external appearance and flat.

The board was distinguished by its resistance to soldering at 350° C. and also by its high mechanical strength as evidenced by manual folding without breaking. When evaluated for fabrication accuracy by the aforementioned patterns, precise fabrication was possible up to a circle of 100 $\mu$m, much higher accuracy than by punching by a mold. The thermal expansion coefficient of the insulation layer was 2.0×10$^{-5}$/° C. The resin layer possessed a sufficiently high adhesive strength of 0.5 kg/cm to the copper foil and showed no peeling at all when manually folded 10 times.

EXAMPLE 2

Using the polyimide precursor solution obtained in Synthetic Example 2, a 10 $\mu$m-thick polyimide layer was formed on a 25 $\mu$m-thick stainless steel foil and evaluated as in Example 1. The base board showed soldering resistance of 330° C., good folding endurance, and excellent flatness. The fabrication accuracy was 100 $\mu$m and the thermal expansion coefficient was 4.3×10$^{-5}$/° C.

EXAMPLE 3

Using the polyimide precursor solution obtained in Synthetic Example 3, a 50 $\mu$m-thick polyimide layer was formed on a 100 $\mu$m-thick aluminum foil and evaluated as in Example 1. The base board showed soldering resistance of 330° C., good folding endurance, fabrication accuracy of 100 $\mu$m and a thermal expansion coefficient of 4.5×10$^{-5}$/° C.

EXAMPLE 4

The polyimide precursor solution obtained in Synthetic Example 1 was applied to a commercially available 25

μm-thick stainless steel foil (product of Nippon Steel Corporation) to a dry thickness of 10 μm and dried at 120° C. for 3 minutes.

On top of the polyimide precursor layer were applied commercially available acid-developing type acrylic photosensitive resins (NCAR, product of Tokyo Process Co., Ltd.) to a dry thickness of 10 μm and dried at 110° C. for 1 minute.

A 15 μm-thick polyester film was laminated to give a four-layer laminate with the structure of stainless steel foil/polyimide precursor layer/photosensitive resin layer/ protective film.

A negative film with the aforementioned parallel pattern was placed in contact with the protective film and exposed to an amount of light of approximately 100 mmNJ/cm$^2$ in a discharge type exposure equipment, Hitech's Model 3000NEL. Thereafter, the laminate was stripped of the protective film and the exposed resins were developed in a simplified shower by a 0.1% aqueous solution of lactic acid at 30° C. and at a water pressure of 1 kg/cm$^2$ for 60 seconds.

The base board whose photosensitive resin layer alone had been patterned was etched in a simplified shower by a 10% aqueous solution of sodium hydroxide at a liquid temperature of 15° C. and at a water pressure of 1.5 kg/cm$^2$ for 10 seconds and then etched by warm water of 40° C. under the same conditions. The bare portion of the polyimide presursor layer was removed clean and the substrate stainless steel foil was visually confirmed.

The remaining photosensitive resins were stripped by applying a shower of a 10% aqueous solution of lactic acid at 30° C. and at a water pressure of 1 kg/cm$^2$ for 40 seconds.

The base board thus obtained was washed with water, heated in a hot-air oven at 130° C. for 10 minutes, and then heated successively at 160, 200, 250 and 300° C. for 2 minutes at each temperature.

The base board possessed a 7 μm-thick polyimide insulation layer patterned with parallel lines spaced at approximately 100 μm intervals, the polyimide layer was in contact with the copper foil free of voids when the cross section of the board was observed, and the board was extremely good in external appearance.

The board withstands soldering at 350° C. and its heat resistance is sufficiently high and presents no problems in the subsequent packaging step.

When the fabrication accuracy was evaluated by the aforementioned parallel pattern, the etch factor was 0.6.

The thermal expansion coefficient of the insulation layer was $2.0 \times 10^{-5}/°$ C. and the board was virtually free of warpage.

The adhesive strength of the resin layer to the stainless steel foil was 0.5 kg/cm, which is sufficiently high and poses no problems in practical use.

In order to form wiring on the patterned base board, copper was deposited by sputtering on the polyimide layer and finally a 5 μm-thick layer of copper was formed by letting the copper deposit function as electrode. This copper layer possessed sufficient adhesive strength to serve as suspension.

Thus, wiring was formed on the stainless steel/polyimide base board as described above, and the stainless steel foil was further etched and folded to give an HDD suspension.

EXAMPLES 5 TO 9

A 7 μm-thick layer of polyimides was formed on a 25 μm-thick stainless steel foil by using each of the polyimide precursor solutions obtained in Synthetic Examples 2 to 6 and evaluated as in Example 1.

The time for etching first by alkali and then by warm water was optimized depending upon the structure of resins used. The results are shown in Table 1.

TABLE 1

|  | Example No. | | | | | |
| --- | --- | --- | --- | --- | --- | --- |
|  | 4 | 5 | 6 | 7 | 8 | 9 |
| Synthetic Example No. | 1 | 2 | 3 | 4 | 5 | 6 |
| Treating time (second) | | | | | | |
| Warm water | 10 | 8 | 12 | 60 | 10 | 90 |
| Alkali | 40 | 40 | 60 | 120 | 40 | 120 |
| Adhesive strength (kg/cm) | 0.5 | 0.7 | 0.5 | 0.6 | 0.6 | 0.4 |
| Thermal expansion coefficient (×10$^{-6}$) | 20 | 33 | 40 | 45 | 48 | 46 |
| Warpage | ○ | ○ | Δ | Δ | Δ | Δ |
| Etch factor | 0.6 | 0.8 | 0.7 | 0.5 | 0.8 | 0.4 |
| Soldering resistance (° C.) | 350 | 350 | 320 | 330 | 320 | 340 |

Area of Industrial Application

Laminates of this invention allow extremely easy fabrication of insulators of high fabrication accuracy and reliability on an electric conductor. The laminates are useful as materials for the manufacture of HDD suspensions of an integrated circuit/wiring structure with high accuracy.

What is claimed is:

1. A laminate suitable for the preparation of a circuit board by fabrication of an insulator comprising:

a layer containing polyimide precursor;

a layer containing a photosensitive resin formed on one surface of said layer containing polyimide precursor; and an electric conductor which is a copper foil of a single thickness, or a stainless steel foil of a single thickness, coextensive with and formed on the other surface of said layer of a polyimide precursor, wherein said polyimide precursor shows a thermal expansion coefficient of $5 \times 10^{-5}/°$ C. or less after curing.

2. The laminate as described in claim 1 wherein said polyimide precursor possesses a repeating unit of the following general formula (1)

(1)

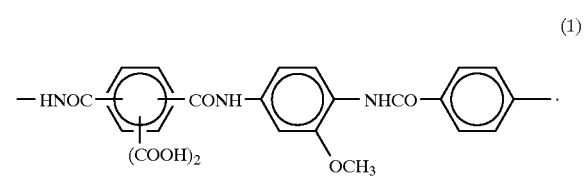

3. A laminate suitable for the manufacture of HDD suspensions, said laminate comprising:

a layer containing a polyimide precursor;

a layer containing a photosensitive resin formed on one surface of said layer of a polyimide precursor; and a stainless steel foil which is 10 to 70 μm thick, wherein said polyimide precursor possesses a main structural unit, said structural unit represented by the following general formula (2)

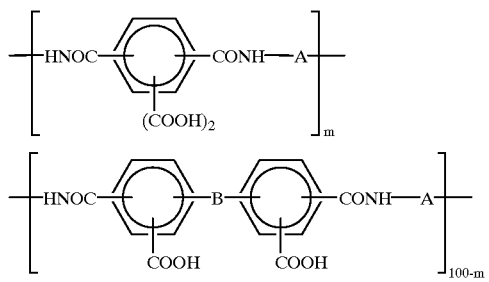

(2)

wherein,

A is a divalent group containing 17 or less carbon atoms, said divalent group containing an aromatic group, B is —CO—, —SO$_2$— or —O—, and m represents the proportion of the structural unit indicated by from 0 to 100 mol %, wherein said photosensitive resin can be developed by acid solution.

4. A laminate, comprising:

a layer containing a photosensitive resin having a thickness of 2 to 100 μm;

a layer containing polyimide precursor having a thickness of 2 to 300 μM and having a thermal expansion coefficient of $5\times10^{-5}$/° C. or less after curing formed under said layer containing a photosensitive resin; and a layer of copper foil or stainless steel foil, having single a thickness of 200 μm or less coextensive with and formed under said layer containing polyimide precursor; wherein said laminate can be used for making a copper foil or stainless steel foil with patterned polyimide insulator by selectively exposing said layer of photosensitive resin, developing the resultant layer containing a photosensitive resin by an acid solution, removing the exposed layer containing a polyimide precursor by etching with an alkaline solution, using the remaining photosensitive resin as a mask, and curing the residual polyimide precursors.

5. A laminate, comprising:

a layer of copper foil or stainless steel foil of a single thickness;

a second layer containing a polyimide precursor having a thermal expansion coefficient of $5\times10^{-5}$/° C. or less after curing placed on and coextensive with said copper foil or stainless steel foil; and a third layer containing a photosensitive resin placed on said second layer containing a polyimide precursor.

* * * * *